United States Patent [19]

Patten, Jr. et al.

[11] Patent Number: 5,762,715
[45] Date of Patent: Jun. 9, 1998

[54] SEGMENTED SUBSTRATE FOR IMPROVED ARC-JET DIAMOND DEPOSITION

[75] Inventors: Donald O. Patten, Jr., Sterling; David G. Guarnaccia, Carlisle, both of Mass.; George A. Fryburg, Atkinson, N.H.

[73] Assignee: Saint-Gobain/Norton Industrial Ceramics Corporation, Worcester, Mass.

[21] Appl. No.: 473,197

[22] Filed: Jun. 7, 1995

[51] Int. Cl.$^6$ .............................. C23C 16/50; C23C 16/00
[52] U.S. Cl. ........................ 118/730; 118/728; 118/500
[58] Field of Search .................... 118/728, 500, 118/730; 264/81

[56] References Cited

U.S. PATENT DOCUMENTS

| | | | |
|---|---|---|---|
| 4,485,759 | 12/1984 | Brandolf | 118/728 |
| 5,204,145 | 4/1993 | Gasworth | 427/577 |
| 5,256,206 | 10/1993 | Schmitt, III et al. | 118/723 |
| 5,304,249 | 4/1994 | Chosa | 118/728 |
| 5,318,809 | 6/1994 | Sussman | 118/715 |
| 5,342,660 | 8/1994 | Cann et al. | 427/249 |
| 5,391,229 | 2/1995 | Kosky | 118/728 |
| 5,435,849 | 7/1995 | Cann et al. | 118/723 |
| 5,529,633 | 6/1996 | Enniss | 118/730 |

FOREIGN PATENT DOCUMENTS 442 303 A1   8/1990   European Pat. Off.

Primary Examiner—Richard Bueker
Attorney, Agent, or Firm—Volker R. Ulbrich; David P. Gordon

[57] ABSTRACT

A mandrel for use in a diamond deposition process for generating free standing diamond films has a segmented surface forming a plurality of surfaces for deposition of diamond. The segmented surface is formed of a plurality of mesa segments on a common supporting base surfaces for the mesas. The mesa segments are preferably removably attached to the common base by any suitable means such as by bolts through the mandrel substrate which extend into the mesa segments. The mesa segments may vary in shape, size, and number, thus permitting different shaped diamond films to be made simultaneously from the same run if desired. The provided arrangement increases yield by reducing losses due to premature lifting of the diamond film during deposition, due to violent lifting after deposition upon cooling of the mandrel, and due to cracking.

18 Claims, 4 Drawing Sheets

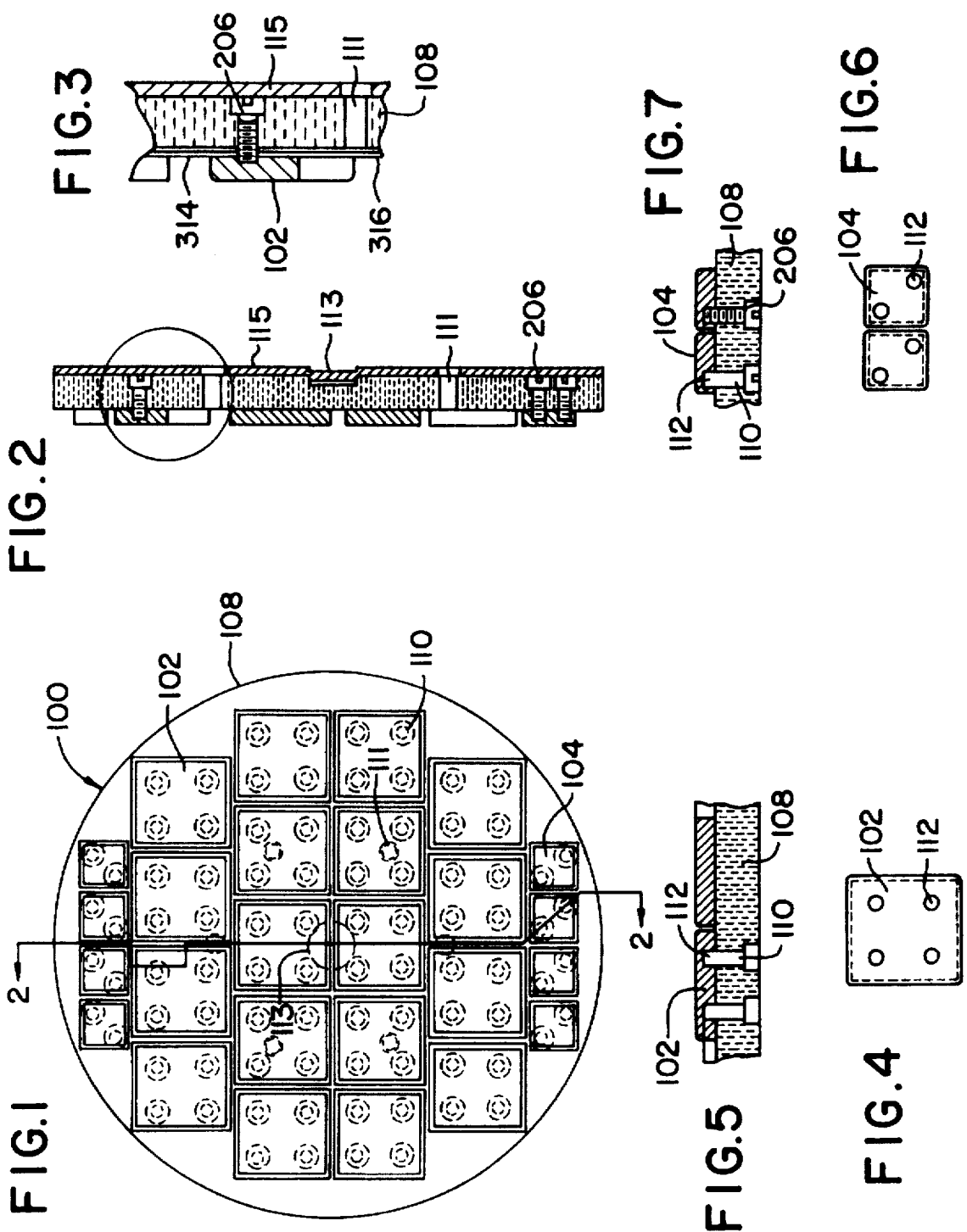

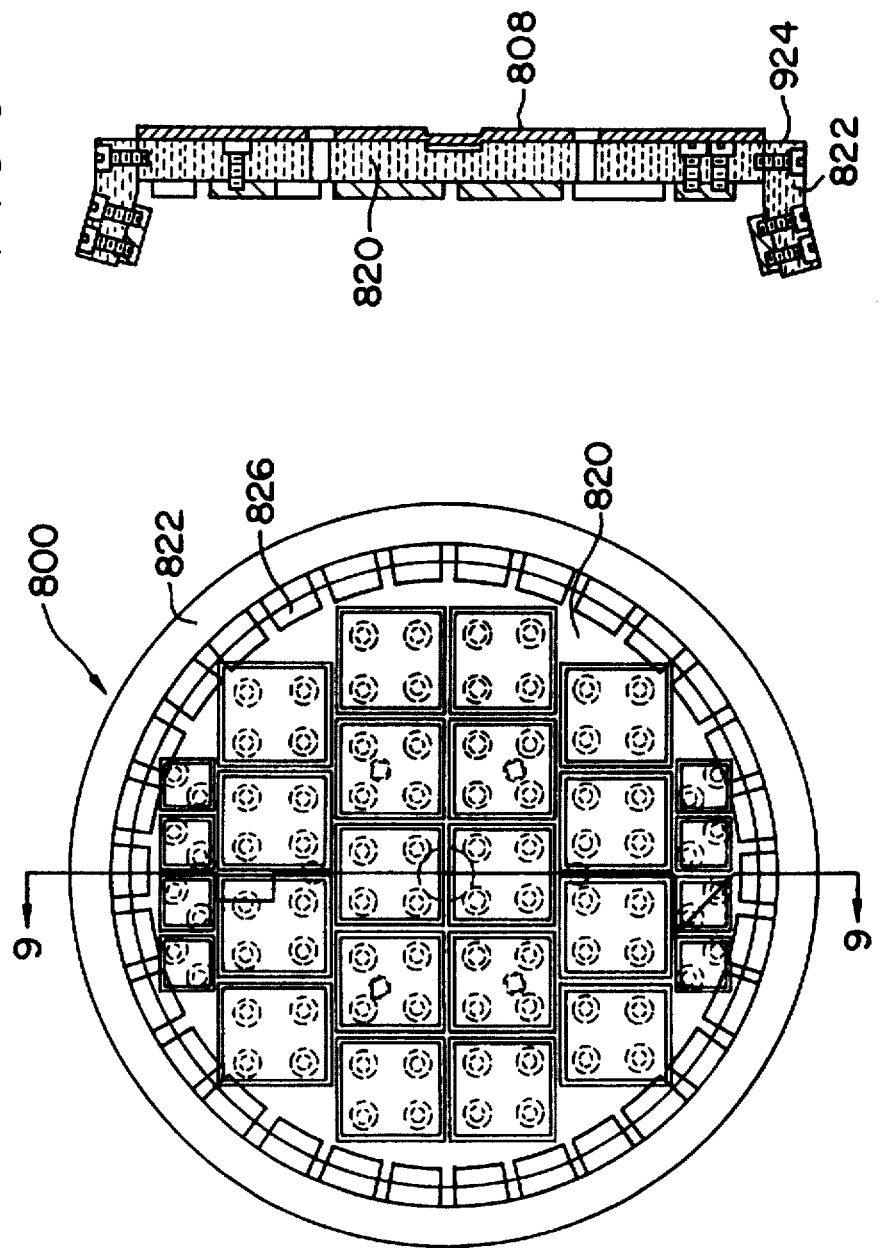

SEGMENTED SUBSTRATE FOR IMPROVED ARC-JET DIAMOND DEPOSITION

BACKGROUND OF THE INVENTION

1. Field of the Invention

This invention relates broadly to the manufacture of diamond films. More particularly, this invention relates to an apparatus and method for manufacturing free standing diamond films in an improved yield by the arc-jet method.

2. State of the Art

Diamond has exceptional hardness, thermal conductivity, electrical insulation and light transmission properties, and is therefore useful in various applications such as cutting tools, heat sinks, insulators, electronic substrate materials, etc. Natural diamond, however, is monocrystalline and limited in size and geometry. As a result, a number of techniques have recently been developed, such as high pressure high temperature deposition (HPHT) and chemical vapor deposition (CVD), for synthesizing and depositing diamond on substrates of various shapes, sizes and materials.

Synthetic CVD diamond film can be deposited as a thin and permanent coating on a substrate, such as on the wear surface of a tool or an environmentally protective coating. When a CVD diamond film is deposited in this manner, it is generally referred to as a "thin film". Thin film CVD diamond deposition is one method of the art used in forming cutting tools. Alternatively, a thicker diamond film can be deposited on a substrate and then removed, preferably intact, as a single "free standing" piece for use in applications such as heat sinks, optical windows, and cutting tools. These free standing pieces are usually referred to as "thick films". Thick films are often formed using a technique known as arc-jet deposition. Arc-jet deposition is well known, and is described, for example, in U.S. Pat. No. 5,342,660, issued Aug. 4, 1994.

In the manufacture of thick films, it is convenient to deposit the diamond on a substrate and then allow thermal stresses during cooling to detach the diamond from the substrate. This process eliminates the requirement of an operation for removing the diamond from the substrate, and allows the substrate to be reused. In general, several considerations must be taken into account when manufacturing free standing diamond films by the deposition of synthetic diamond on a substrate. A first consideration is that a relatively weak bond between the diamond and substrate is essential to ensure that the diamond will easily detach from the substrate. Another consideration is that the substrate material and diamond will generally have different coefficients of expansion, as well as different molecular and chemical structures, all of which will affect; the growth, adhesion, and smoothness of the diamond film. Other factors, such as surface preparation, and deposition parameters will also affect the growth and adherence of the synthetic diamond on the substrate.

Titanium nitride coated molybdenum and other materials having similar properties, such as titanium-zirconium-molybdenum alloys and tungsten, are now being used by the assignee hereof as a substrate (mandrel) upon which synthetic diamond is to be deposited. These materials are chosen because of their desirable coefficients of expansion, and their machinability. In other words, these substrates provide desirable "non-adherent", or actually "controlled adhesion" properties where the diamond will intimately adhere to the substrate during deposition, yet will release from it without breaking once the process is complete. Thus, a layer of synthetic diamond can be deposited on a TiN coated molybdenum substrate, such as by CVD. The mandrel configuration commonly used by the assignee hereof is the mesa type, having a base portion and a stepped upper portion of a smaller size than the base portion. In the mesa type mandrel, both the base and upper portions typically have a circular shape. The size of such a mandrel as used by the assignee hereof has generally been of the order of about 3.5 to 4.0 inches in diameter, because yields on larger sized mandrels have been extremely poor due to lifting and cracking problems. Indeed, yields even at the 3.5 to 4.0 inch diameter sizes are still unacceptably low. It should be appreciated that if the deposited diamond film should rupture during cooling and detachment from the mesa surface, the entire diamond film may be fractured and lost, representing a total loss and therefore, considerable loss of time, effort, and money. While increasing the thickness of the diamond layer tends to reduce cracking, it will be appreciated by those skilled in the art that increasing the thickness will correspondingly increase the time and cost of manufacture.

SUMMARY OF THE INVENTION

It is therefore an object of the invention to provide a substrate for making a free standing diamond film.

It is also an object of the invention to provide a substrate which improves yield by allowing deposition over a large surface while reducing losses due to cracking and lifting.

It is a further object of the invention to provide a substrate and method of using the substrate in making a free standing diamond film which allows for the more reliable and easy removal of the diamond film from the substrate with less loss due to fracture or premature lifting.

It is another object of the invention to provide a substrate useful in making a free standing diamond films, where the substrate has a plurality of deposition segments.

It is an additional object of the invention to provide a segmented substrate for diamond film deposition which reduces the loss of diamond film if there is cracking/breaking of a diamond film on a segment surface when the diamond releases and is subsequently removed from the substrate.

A further object of the invention is to provide a substrate for making free standing diamond films, wherein a plurality of mesa segments of different configuration may be used with a common base substrate in a single deposition operation.

In accordance with the objects of the invention, which will be discussed in detail below, the invention broadly comprises a substantially non-adherent mandrel substrate having a base plate and a plurality of spaced mesa deposition surfaces; i.e., a segmented substrate. In order to increase the deposition yield by reducing the percentage of runs lost due to lifts and/or cracking, while at the same time allowing deposition across more area than is possible with the current standard 3.5 and 4.0 inch diameter substrates, each of the spaced deposition surfaces measures preferably less than three inches in its longest dimension. The spaced deposition surfaces should also increase deposition efficiency as the amount of active species gas which is spilled off the edge without interacting with the top surface of the substrate should be substantially reduced. The segmented substrate has potential application to any method or system of producing CVD diamond, including arc-jet deposition systems.

As stated above, in the present invention, a segmented mandrel substrate is provided having a plurality of deposition surfaces. According to preferred aspects of the invention, the mandrel comprises a base plate of molybdenum or other material which has a low or controlled adherence to diamond deposits. The mandrel base plate is generally cylindrical in shape with an upper and lower surface. A plurality of mesa segments are removably attached to the upper surface of the base plate by suitable means, such as by bolts passing through holes in the base plate with the bolts extending into the face of the mesa segments in contact with the upper surface of the base plate. The mesa segments have a lower face in contact with the upper surface of the base plate, and an upper deposition surface, and a thickness such as to form a side wall or flank. Alternatively, and equivalently, the substrate may be made from a single piece with a plurality of separated mesas extending upwardly from a base, with the mesas being formed by machining grooves in the substrate.

According to other aspects of the invention, the mesa segments may be generally formed of sintered or arc cast molybdenum, or a molybdenum alloy (e.g., TZM) with a film on the upper surface and sides of a material which is more adherent to diamond film deposits, such as TiN. The mesa segments may have a configuration in the horizontal plane of any suitable polygonal shape, e.g. rectangular, hexagonal, triangular, circular and the like. The segments are arrayed on the base plate in such a manner as to put the most segments on the base plate as possible to enhance the effective yield of diamond film for each run. Segments of different configuration may be used in the same run with the provided apparatus and process, which provides a greater flexibility where the amount of diamond of a particular deposition shape is less than the total capacity of the mandrel.

If desired, one or more thin material interlayers may be interposed between the base and the mesas. In one embodiment, the thin material is a thin layer of copper. In another embodiment, a thin graphite fabric (e.g., GRAFOIL—a trademark of Union Carbide) covered by a thin layer of molybdenum foil. In either case, the thin material(s) helps maintains proper tension on the bolts and improves heat transfer between the segments during the deposition process.

In a further embodiment, an alternative base structure is used, in which there is a cylindrical ring attached to the periphery of the base plate, either normal to or at an angle to the plane of the base plate. Additional deposition segments may be bolted to this cylindrical ring, which provides additional deposition surfaces within a given plasma torch size, and a longer, more torturous path to increase the interaction of active gas species with the substrate.

With the mandrels of the present invention, lifting of the diamond film is reduced due to the reduced size of the mesas. In addition, any lifting which might occur during the process on one segment, or violent lifting while cooling, will not destroy the entire diamond deposit since the remaining deposits on the separate mesa segments will not be of affected.

Additional objects and advantages of the invention will become apparent to those skilled in the art upon reference to the detailed description taken in conjunction with the provided figures.

BRIEF DESCRIPTION OF THE DRAWINGS

FIG. 1 is a plan view of a first embodiment of the invention having a cylindrical mandrel base plate with a plurality of square mesa segments attached to its surface;

FIG. 2 is a view in cross-section of a representative embodiment of FIG. 1 showing different size mesa segments bolted to the mandrel base plate;

FIG. 3 is an enlarged view of a part of the cross-sectional view of FIG. 2, showing a mesa segment bolted to the base plate, and interlayers between the base plate and the segments and a separate graphite layer on the lower surface of the base plate;

FIGS. 4 and 5 are respectively a plan view and a cross-sectional view thereof, showing the bolting arrangement for a one inch nominal segment;

FIGS. 6 and 7 are respectively a plan view and a cross-sectional view thereof, showing the bolting arrangement for a one-half inch nominal segment;

FIG. 8 is a plan view of an alternative segmented mandrel according to the invention, showing a cylindrical rim attached to the periphery of the mandrel base plate for supporting additional mesa segments;

FIG. 9 is a view in cross-section of the segmented mandrel of FIG. 8, showing the bolting arrangement of the mesa segments;

DETAILED DESCRIPTION OF THE PREFERRED EMBODIMENTS

Figure 10:
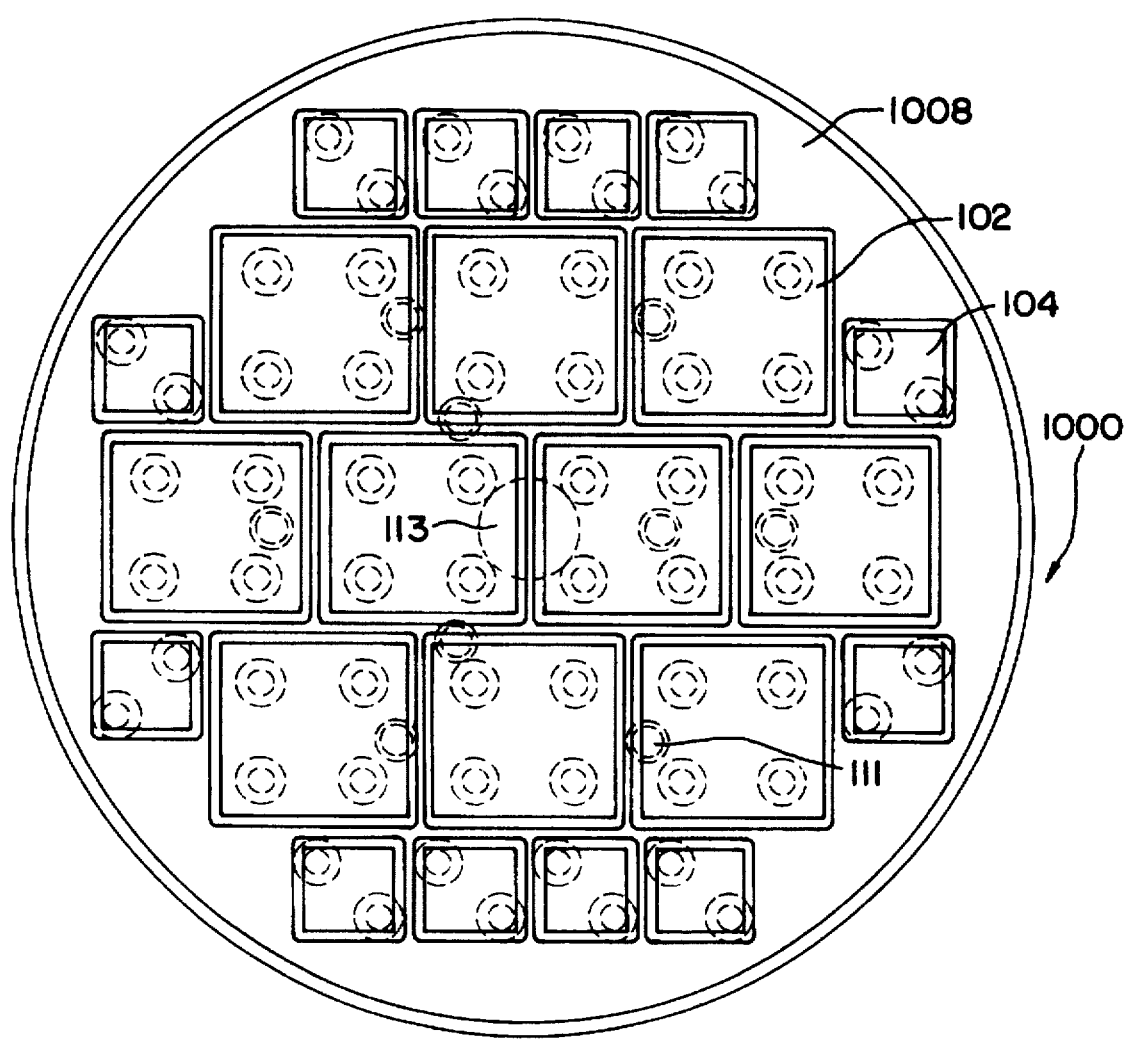
FIG. 10 is an enlarged plan view of a segmented mandrel of the invention having a smaller base plate than that of FIG. 1.

Turning now to FIGS. 1 through 7, a first embodiment of the segmented mandrel or substrate 100 of the invention is shown. The segmented substrate comprises in general a plurality of detachable TiN coated molybdenum segments (mesa segments) 102 and 104, attached with TZM (a high strength molybdenum alloy of approximately 0.5% titanium, 0.08% zirconium, 0.01%–0.04% carbon, and the remainder molybdenum) screw fasteners 206 to a TiN coated molybdenum base plate 108 via bore holes 110 in the base plate 108, and preferably threaded bores 112 in the mesa segments 102. In FIG. 1, the mesa segments include a plurality of nominally half inch by half inch squares 104 and a plurality of nominally one inch by one inch squares 102 arrayed to fill the area available on the six inch diameter molybdenum base plate 108. The mesa segments are typically approximately 0.2 inches in height (thickness), and are preferably separated from each other by grooves of approximately 0.05 inches in width.

In the preferred embodiment of the invention, and as best seen in FIG. 3, a thin layer of 0.005 inch GRAFOIL 314 which is in turn covered by a 0.001 inch foil of molybdenum 316 is installed over the surface of base plate 108 between the mesa segments 102 and 104 and the base plate 108. The thin layers are intended to improve the reliability of the heat transfer between the segments 102 and 104 and the base plate 108, and the thin GRAFOIL and molybdenum layers serve to maintain tension on the fasteners 206. In addition, as the GRAFOIL interlayer is somewhat compressible and thereby accommodates local material asperities which might otherwise make repeatable contact problematic. The screw tension at operating temperature can be varied by adjusting the thickness of the GRAFOIL interlayer 314. It is noted that the thin layer of molybdenum foil 316 is placed on top of the GRAFOIL layer 314 to avoid any contamination of the diamond from the GRAFOIL. In a run for arc-jet diamond film using the segmented substrate mandrel 100 with the molybdenum/GRAFOIL layers, the GRAFOIL/molybdenum interface 318 was found to perform well. The screw fasteners 206 remained tight through the run, the thermal resistance appeared to be consistent from segment to segment, and the segments 102 and 104 were easily removed at the conclusion of the run.

Instead of using the molybdenum and GRAFOIL layers, it will be appreciated that other thin layer materials, e.g., copper, could be utilized. A copper layer will also improve the reliability of the heat transfer between the segments 102 and 104 and the base plate 108, and will also maintain tension on the fasteners 206. In addition, as copper will become soft at the deposition temperature, the copper layer will also accommodate local material asperities.

As seen best in FIGS. 1 and 2, additional bore holes 111 are provided for attaching the base plate 108 to a rotation means (not shown). A centering hole 113 is also provided at the center of the lower surface of base plate 108 for attachment to a rotating spindle or pin (not shown). In addition, a graphite spacer 115 may be added to maintain heat conductivity through the base plate 108 and segments 102 and 104 to a heat extraction system (not shown). In addition, the graphite spacer disk 115 will prevent the fasteners 206 from loosening and releasing the segments 102 and 104.

FIGS. 5 through 7 illustrate in greater detail the structure of mesa segments 102 and 104, and their attachment to base plate 108 by means of screw fasteners 206 via the bore holes 110 in the base plate and the bores 112 in mesa segments 102 and 104.

FIGS. 8 and 9 show a variation of the above described arrangement for a segmented substrate 800, fabricated in a dished shape, where the segment supporting base plate 808 has an outer diameter curved upward out of the plane of the central region 820. This modification may improve deposition rate of diamond film through enhanced interaction of the plasma beam with the substrate along the gas flow path, increasing the effective substrate area which can be coated for a given plasma torch size, and by providing a means of controlling the thickness profile of the deposited diamond through adjustments to the base plate shape. The embodiment of FIGS. 8 and 9 is formed by adding a cylindrical ring 822 to the outer diameter 924 of the standard base plate design 100, shown in FIG. 1, and by supporting a ring of segments 826, either normal to or at some angle to the plane of base plate 108. This also increases the deposition surface and thus the eventual yield of the process.

FIG. 10 is an enlarged schematic of a segmented substrate 1000 having a base plate 1008 which is smaller than the mandrel of FIG. 1. In comparing FIGS. 1 and 10, it will be appreciated that the segmented substrate 1000 of FIG. 10 has a different array of mesa segments, with additional nominal half inch by half inch segments 104 and fewer nominal one inch by one inch segments 102.

Figure 11:
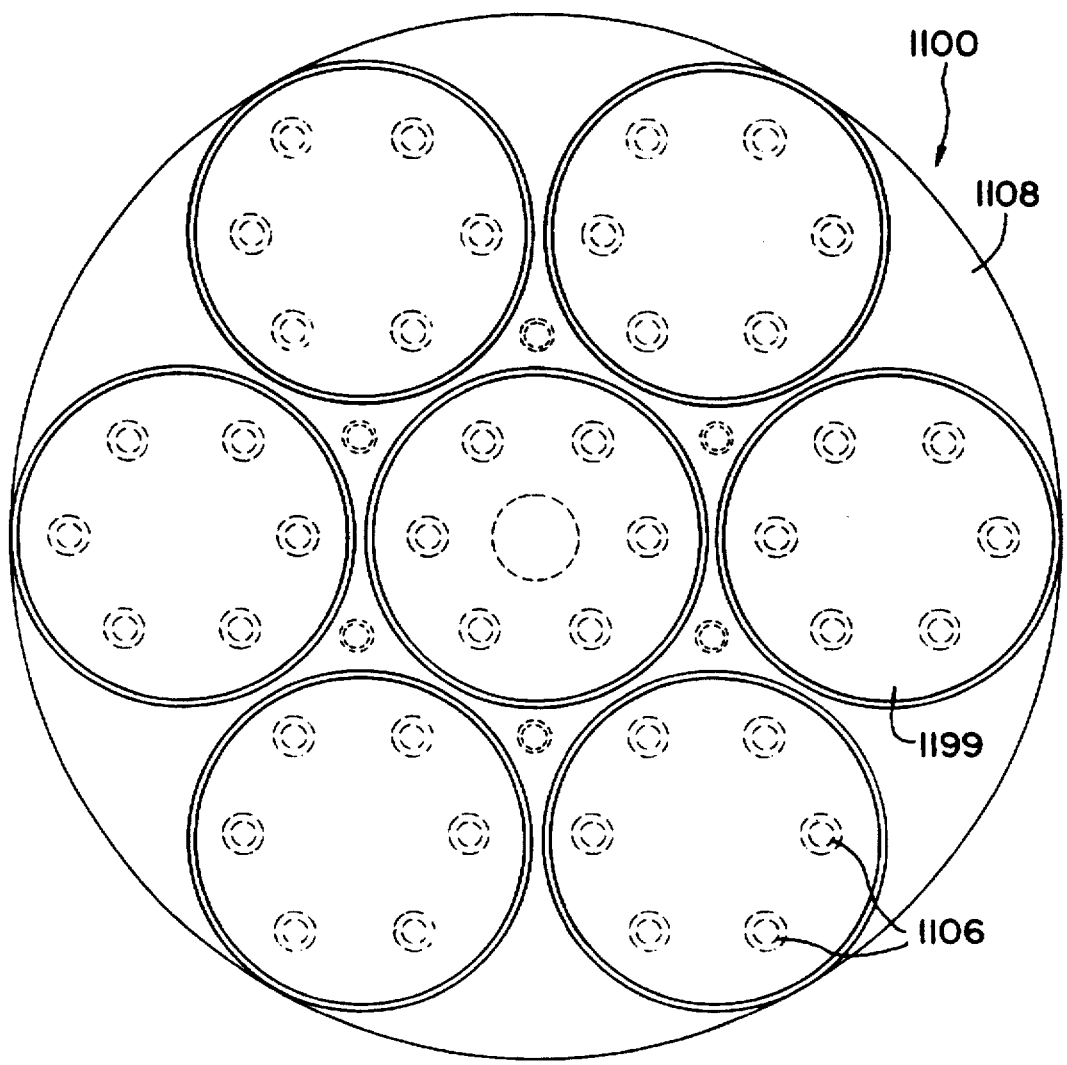
FIG. 11 is a plan view of a cylindrical base plate having a plurality of round segments attached thereto.

FIG. 11 is plan view of a segmented substrate 1100 having a base plate 1108 which is slightly greater than 7.5 inches in diameter. The circular segments 1199 which are coupled to the base plate by fasteners 1106 are each nominally 2.5 inches in diameter. It will be appreciated that the advantage of the array of circular segments of FIG. 11 are advantageous in that it is often easier to generate a circular segment rather than providing slightly rounded edges to substantially square or polygonal segments as may be seen by close examination of FIGS. 1, 8 and 10.

From the above, it will be appreciated that the advantages of the segmented substrate arrangement of the invention include reductions in yield losses due to lifting, because lifting is reduced when the longest dimension of the individual diamond surface is reduced. In addition, a lift on any individual segment will not be transferred to adjacent segments. This will allow even runs which experience some lifting to continue to completion, producing an increased yield of diamond at the intended thickness.

An additional advantage of the invention is that the yield will increase due to a reduction of losses due to cracking. Again, cracking is reduced as a result of reducing the individual diamond coupon size, and thereby minimizing intrinsic stresses. In particular, the smaller diamond segments will experience a smaller release of strain energy on cool-down and separation from the substrate, thereby increasing the percentage of intact squares produced; i.e., yield. Cracking at the corners of the segments are substantially prevented by avoiding sharp corners on the closely spaced segments, and providing fully radiussed corners on the segments.

In order to maximize yield, it will be appreciated that the distance between mesas should be kept small. However, at the same time, it is desirable to minimize any tendency for the diamond to grow across the gaps between segments, thereby potentially transferring lifts from one segment to the next. Thus, the distance of 0.05 inches between mesas (i.e., groove width) has been found as a suitable compromise, although other distances can be used.

Although the individual diamond size has been reduced by providing the separated mesas, a larger total area can be coated, increasing overall productivity. Runs have been conducted with six inch and seven and a half inch base plate diameters. The current theoretical yield for tool diamonds from a three and one half inch diameter mesa substrate is twenty-six half inch by half inch squares. The seven and a half inch segmented substrate can produce eighty half inch by half inch squares per run. The total deposition rate advantage can be compared as follows. Consider a standard thick film diamond recipe which produces approximately ten microns per hour. (On a four inch substrate this translates to a mass deposition rate of 0.29 grams per hour. The first trial with the seven and a half inch segmented substrate using the same deposition parameters resulted in a mass deposition rate of 0.46 grams per hour, an increase of nearly sixty percent. The average linear deposition rate is reduced to 6.4 microns per hour because of the larger area being coated. Applying the same ratio of linear deposition rates to the three and one-half inch diameter mandrels, one obtains nearly twice the productivity in terms of squares per hour.

There have been described and illustrated herein several embodiments of a method and apparatus for manufacturing free standing diamond films. While particular embodiments of the invention have been described, it is not intended that the invention be limited thereto, as it is intended that the invention be as broad in scope as the art will allow and that the specification be read likewise. Thus, while particular mandrel segment shapes and sizes have been disclosed, it will be appreciated that other shapes and sizes may be used as well. While a generally square and circular mesa segments have been disclosed, other geometries such as rectangular, triangular, hexagonal, octagonal, etc. may be used. Furthermore, while particular types of mandrel substrates and substrate coatings have been disclosed, it will be understood that other mandrel substrates and substrate coatings can be used. For example, and not by way of limitation, while a molybdenum base plate has been described, the base plate could be formed from TZM, tungsten, graphite, or almost any other refractory material. Also, while a titanium nitride coated molybdenum mandrel substrate has been disclosed, a titanium carbonitride coated molybdenum mandrel substrate may also be used. Also, if desired, each mesa may be provided, if desired with a band as disclosed in co-owned copending U.S. Ser. No. 08/388,788 which is hereby incorporated by reference in its entirety herein. In addition, while screws have been used to fasten the mesa segments to the mandrel base plate, it will be understood that other suitable means may be used to fasten the segments to the base plate, such as tongue and groove arrangements, and the like so long as the segments remain attached during the deposition process and may be removed thereafter. In fact, if the segments are formed directly on the mandrel base plate such as by machining the base plate to form separated mesas, no screws will be required at all. It will therefore be appreciated by those skilled in the art that yet other modifications could be made to the provided invention without departing from the spirit and scope of the appended claims.

We claim:

1. An apparatus for making free-standing diamond film, comprising:

a mandrel having a base plate and a plurality of spaced mesa deposition surfaces, said mandrel including mesa segments on which said mesa deposition surfaces are located, said mesa segments being removably attached to said base plate of said mandrel, and a flexible, heat conducting layer material interposed and compressed between said mesa segments and said base plate for providing improved heat transfer.

2. An apparatus according to claim 1, wherein:

said base plate is circular.

3. An apparatus according to claim 2, wherein:

said mesa segments are substantially circular in configuration.

4. An apparatus according to claim 2, wherein:

said base plate is adapted to be attached to a means to rotate said plate about a central axis of said base plate.

5. An apparatus according to claim 1, wherein:

said base plate is made from molybdenum.

6. An apparatus according to claim 1, wherein:

said mesa segments are made from molybdenum, and said mesa deposition surfaces comprise films of titanium nitride on said molybdenum mesa segments.

7. An apparatus according to claim 6, wherein:

said mesa segments are made from a molybdenum alloy.

8. An apparatus according to claim 1, wherein:

said base plate is circular, and said mesa segments are substantially polygonal.

9. An apparatus according to claim 8, wherein:

said mesa segments are substantially quadrilateral in configuration.

10. An apparatus according to claim 9, wherein:

a first mesa segment is of a first size, and a second mesa segment is of a second size different than said first size.

11. An apparatus according to claim 8, wherein:

said mesa segments have rounded corners.

12. An apparatus according to claim 1, wherein:

said base plate has a cylindrical collar around its periphery, said cylindrical collar providing area for additional mesa deposition surfaces.

13. An apparatus according to claim 12, wherein:

said cylindrical collar is disposed substantially normal to a plane of said base plate.

14. An apparatus according to claim 12, wherein:

said cylindrical collar is disposed at an angle outwardly from a plane of said base plate.

15. An apparatus according to claim 1, wherein:

said flexible, heat conducting layer comprises a copper foil.

16. An apparatus according to claim 1, wherein:

said flexible, heat conducting layer comprises a layer of graphite fabric.

17. An apparatus according to claim 16, wherein:

said flexible, heat conducting layer further comprises a molybdenum foil layer.

18. An apparatus according to claim 1, wherein:

said plurality of spaced deposition surfaces are separated by distances of approximately 0.05 inches.

* * * * *